(12) United States Patent
Hsu et al.

(10) Patent No.: US 7,083,902 B2
(45) Date of Patent: Aug. 1, 2006

(54) PROCESS FOR FABRICATING SUPERSPHERE SOLID IMMERSION LENS

(75) Inventors: Wensyang Hsu, Hsinchu (TW); Yi-Ting Sun, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 32 days.

(21) Appl. No.: 10/793,788

(22) Filed: Mar. 8, 2004

(65) Prior Publication Data
US 2005/0196708 A1    Sep. 8, 2005

(51) Int. Cl.
G02B 3/00    (2006.01)
(52) U.S. Cl. .................. 430/321; 430/330; 430/394
(58) Field of Classification Search .............. None
See application file for complete search history.

(56) References Cited
FOREIGN PATENT DOCUMENTS
JP    11-048354 A  *  1/1999

OTHER PUBLICATIONS

H. Lorenz et al.; "Fabrication of Photoplastic High-Aspect Ratio Microparts and Micromolds Using SU-8 UV Resist"; *Microsystem Technologies 4*; pp. 143-146; 1998.

Yuh-Sheng Lin et al.; "Polymide as the Pedestal of Batch Fabricated Micro-ball Lens and Micro-Mushroom Array"; *Micro Electro Mechanical Systems,*; MEMS 2001; The 14th IEEE International Conference Jan. 21-25, 2001; pp. 337-340.

Youngjoo Yee et al.; "Micro Solid Immersion Lens Fabricated by Micro-Molding For Near-Field Optical Data Storate"; *Optical MEMS*, 2000 *IEEE/LEOS International Conference*, Aug. 21-24, 2000; pp. 91-92.

* cited by examiner

Primary Examiner—John A. McPherson
(74) Attorney, Agent, or Firm—Troxell Law Office, PLLC

(57) ABSTRACT

The present invention relates to process for fabricating supersphere solid immersion lens (SSIL). The procedure of the present invention comprises the steps of: firstly, coating a positive photoresist layer on a substrate, followed by first exposure and second exposure with different exposure dose separately by first mask and second mask to form the positive photoresist structure with different dimensions and depths. The first exposure dose is supplied enough to make sure the patterns of the first mask can be observed on the positive photoresist layer during the alignment of the second exposure process. And the following reflow process forms a supersphere solid immersion lens (SSIL) structure.

13 Claims, 5 Drawing Sheets

PROCESS FOR FABRICATING SUPERSPHERE SOLID IMMERSION LENS

REFERENCE CITED

1. "Fabrication of photoplastic high-aspect ratio microparts and micromolds using SU-8 UV resist" *Microsystem Technologies* 4 (1998), pp. 143–146.
2. "Polyimide as the pedestal of batch fabricated micro-ball lens and micro-mushroom array", *Micro Electro Mechanical Systems,* 2001. MEMS 2001. *The* 14*th IEEE International Conference on* 21–25 Jan., 2001.
3. "Micro solid immersion lens fabricated by micro-molding for near-field optical data storage", *Optical MEMS,* 2000 *IEEE/LEOS International Conference on* 21–24 Aug. 2000, pp. 91–92.

FIELD OF THE INVENTION

The present invention relates to semiconductor fabrication method. More particularly, the invention relates to process for fabricating supersphere solid immersion lens by only one positive photoresist layer coating.

DESCRIPTION OF THE RELATED ART

Information storage and retrieval has become immensely important as a result of the increased need for information exchange in the modern, high technology society of today. The rapidly growing urge for increased access to information has spurred the development of ever larger and faster data storage and retrieval systems.

Optical discs have the advantages of high data storage capacity, durable in structure, long life of use, low manufacturing cost, and reliable data storage capability. Due to these reasons, the optical discs are replacing the magnetic storage media, such as magnetic disks, as the main mass data storage medium in the present information age. For example, near field recording is a popular way used to increase the data storage density. Near field recording is also proposed to apply in the magneto-optic (MO) recording device. In magneto-optic recording, data is represented as a magnetic domain in a magnetizable recording medium such as a disc. Each domain is a stable magnetizable data site representative of a data bit. Data is written to the medium by applying a focused beam of high intensity light in the presence of a magnetic field. The disc typically includes a substrate, a magneto-optic recording layer, a reflective layer, and two or more dielectric layers. In the near field recording, supersphere solid immersion lens (SSIL) is a powerful device to reduce the recording spot size efficiently. So many studies have also been proposed to fabricate the SSIL.

According to paper "Fabrication of photoplastic high-aspect ratio microparts and micromolds Using SU-8 UV resist" in Microsystem Technologies (1998) pp. 143–146, This fabrication use negative photoresist material SU-8 to fabricate cubic micro structure having different thickness and dimension. That discloses several repeated lithography fabrication and coatingion of photoresists are needed in the fabrication. Also, this method is applied only when negative photoresist is used as materials. And, related material of micro structure is formed of negative photoresist SU-8 that is inconvenient to transfer pattern by the following reflow process due to its strong structure after being exposed.

Due to nature of negative photoresist, this fabrication may be achieved by using repeated coatingion of photoresist and lithography. Because of fabrication will become more complex, further, more important is that micro-structure which is fabricated by using negative photoresist is normally too hard, therefore, it is uneasy to proceed some specific structures like a smooth hemispherical surface. But in the fabrication process of microlens, combined lithography fabrication with reflow process to fabricate microlens is one of the general methods. Therefore, if using negative photoresist material to define micro-structure and then by reflow process, is unable to form a smooth curved surface of sphere from micro-structure.

"Material A" is used as a pedestal, and defined a cylinder structure by using "material B" on the pedestal. With reflow process and inter polymerization efficiency of pedestal to form supersphere solid immersion lens, as described in "Polyimide as the pedestal of batch fabricated micro-ball lens and micro-mushroom array" *Micro Electro Mechanical Systems,* 2001. MEMS 2001. *The* 14$^{th}$ *IEEE International Conference,* pp. 21–25, Jan. 2001. Twice coatingion of photoresist which are combined with lithography fabrication are needed in the above fabrication method, therefore, this method is more complex. Moreover, two types of no interaction materials are needed in this fabrication.

Pedestal still exists under the supersphere lens which is fabricated according the above method. But usage of supersphere immersion lens are most applied for focusing incident light to bottom for recording data, therefore, supersphere lens which are fabricated by this method still need other optical path to transfer, if not, it is unable to apply in usage of recordable in light storage.

With reference to paper titled "Micro solid immersion lens fabricated by micro-molding for near-field optical data storage" *Optical MEMS,* 2000 *IEEE/LEOS International Conference on* 21–24 Aug. 2000, pp. 91–92, that discloses a hemisphere fillister as mother mold is etched from substrate which is formed from silicon by wet etching method; followed by utilizing hot-pressing high polymer materials into mother mold to fabricate supersphere solid immersion lens. But in the process of using wet etching method to etch a hemisphere fillister from a substrate which is formed from silicon, is uneasy to control outline and curvature of fillister, and high roughness also appeared on the surface of fillister.

Therefore, there are many etching parameter such as accurate readjustment etching solution prescription, etching temperature, stirring time, stirring etching solution should be controlled precisely in this method. If one of the above factors is not fit in requirement conditions, outline of fillister being etched will be different from original designed dimension. Therefore, surface curvature and smoothness of supersphere solid immersion lens which are fabricated after the following hot-pressing step is hard to satisfy optical application. This method should take care of many variable factors and control them precisely in the fabrication process.

SUMMARY OF THE INVENTION

Therefore, the main purpose of the present invention is to fabricate supersphere solid immersion lens (SSIL) by utilizing single positive photoresist layer combined with lithography fabrication to produce micro-structure with different dimension, and followed by reflow process.

Another attempt is to fabricate supersphere solid immersion lens by using a method which is simpler than conventional methods, and not only having a small inaccuracy value in dimension and design, but also having value of application.

Another aspect of the present invention is to provide application in optical pick up head, in the step of other apparatus of optical pick up head utilize semiconductor fabrication to proceed alignment with supersphere solid immersion lens which is fabricated by the present invention, with integration of batch fabrication.

For this above purpose, the present invention is a process for fabricating supersphere solid immersion lens. The procedure according to the present is as follows: obtain a substrate and coating a single positive photoresist layer on the substrate, followed by a sufficient first exposure dose to produce patterns which can be observed under microscope in positive photoresist layer before develop step. This is because that the exposed positive photoresist layer, nature of exposed portions is different with surrounding unexposured portions, causing difference under observation of microscope, therefore, lead to patterns of first exposure can be observed on positive photoresist layer without develop step.

Then, a second exposure is applied by second mask. In second exposure by aligning the patterns caused by first exposing portions on positive photoresist layer to proceed second exposure with different exposure dose, so that the patterns of the first mask and the second mask can be transferred to the specific regions in the positive photoresist. This step can be operated repeatedly.

If the second exposure dose is different to the first exposured dose, a positive photoresist layer structure with different thickness and specific patterns can be obtained due to different exposure dose and patterns of masks in multi-exposure after a develop step of positive photoresist layer. Only one positive photoresist layer coating combined with multi-exposure and once develop step are required in this whole fabrication.

Repeatedly operation according the above step, by utilizing multi-exposure with different exposure dose in the process, as a result, a positive photoresist layer structure with multi thickness and dimensions can be fabricated. Finally, followed by the reflow step, a supersphere solid immersion lens can be formed.

BRIEF DESCRIPTION OF THE DRAWINGS

The present invention will be better understood from the following detailed description of preferred embodiments of the invention, taken in conjunction with the accompanying drawings, in which.

DESCRIPTION OF THE PREFERRED EMBODIMENTS

The following descriptions of the preferred embodiments are provided to understand the procedures and the features of the present invention.

Figure 1:
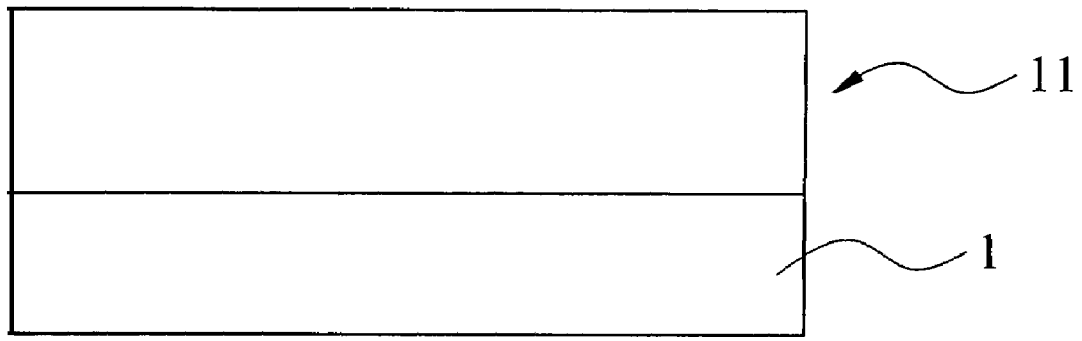
FIG. 1 is a view showing step (1) according to the present invention.
Figure 5:
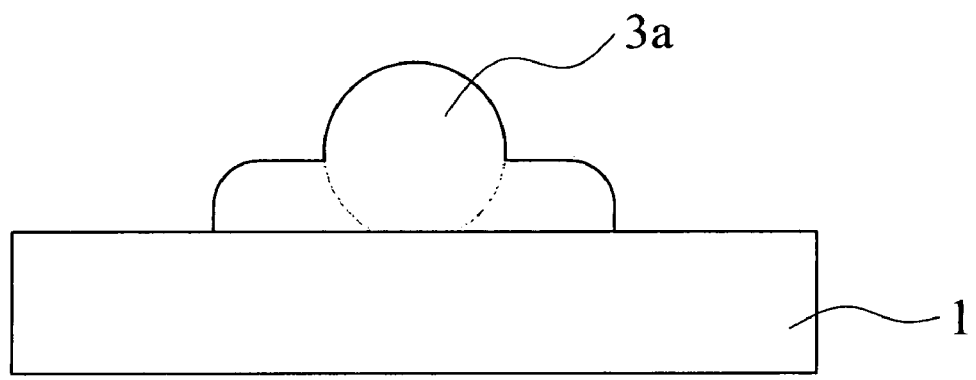
FIG. 5 is a view showing step (5) according to the present invention.

With reference to FIG. 1 till FIG. 5, these figures showing procedures of process for fabricating supersphere solid immersion lens according to this present invention, said procedures comprise the steps of:

(1) Coating a positive photoresist layer 11 on a substrate 1, the substrate is selected from any sort of a substrate;

(2) Applying first mask 12 on the positive photoresist layer 11 for transferring the pattern of the first mask 12 to a specific area on the positive photoresist layer 11 and the specific pattern caused by first exposure step on the first positive photoresist layer is called 121.

The dose of first exposure step at least allows pattern 121 on the positive photoresist layer 11 transferred from the mask 12 can be observed by the microscope during aligning. The exposure dose of first exposure step depends on the thickness and different types of the positive photoresist layer 11. The first positive photoresist pattern 121 is at least a depth of 10 anstron, which is known as $t_1$.

(3) Applying second mask 13 on the positive photoresist layer 11 for transferring the pattern of the second mask 13 to a specific area on the positive photoresist layer 11 and the specific pattern on the photoresist layer caused by the second exposure is called 131. The pattern of the second mask 13 can be transferred to the desired areas on the positive photoresist layer by aligning the pattern 121 caused by first exposure during the second exposure step. The pattern 131 on the positive photoresist layer is at least a depth of 10 anstron, which is known as $t_2$. The first photoresist pattern 121 and second photoresist pattern 131 could have overlapping portions. The second exposure dose depends on the dimension of the designed structure. The first mask 12 and second mask 13 have different patterns each other.

(4) By using readjustment the difference of first exposure dose and second exposure dose, and then dipping the substrate 1 into the developer for dissolving exposing portions of the positive photoresist layer 11 caused by first exposure and second exposure, a positive photoresist micro-structure 3 with different thickness and dimensions can be formed on the positive photoresist layer 11.

(5) Applying reflow process to the micro-structure 3 to form supersphere solid immersion lens (SSIL) structure 3a inside the micro-structure 3. The reflow process proceeds at least at a temperature which enables the positive photoresist micro-structure 3 transfer to a hemisphere-shaped outline.

Thus, by coating a single positive photoresist layer 11, SSIL structure 3a can be fabricated.

Step (3) which stated above can be proceeded repeatedly by using of a third patterned mask, or a fourth patterned mask or more defined patterned masks with different exposure dose separately to form a multi-thick and multi-dimension micro-structure positive photoresist layer like micro-structure 3. This multi-thick and multi-dimension micro-structure on the positive photoresist layer comprise of different thickness and types, due to multi types of patterned masks are used with different exposure dose to transfer different shapes of patterns to the positive photoresist layer 11.

The preferred embodiment according to the present invention, with reference to FIG. 1 till FIG. 5, comprising the following steps of:

FIG. 1 illustrates a positive photoresist layer 11 is coated on a substrate 1.

Figure 2:
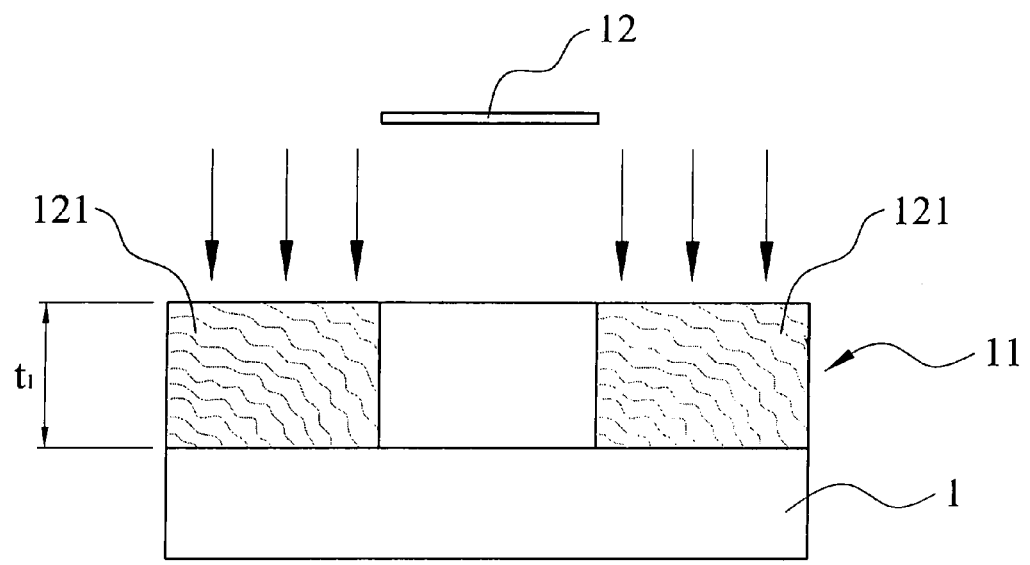
FIG. 2 is a view showing step (2) according to the present invention.

As illustrated in FIG. 2, transfer the pattern of the first mask 12 to the positive photoresist layer 11 by first exposure step to form the specific pattern 121 which is easy dissoluble in the positive developer. And the first exposure dose of first exposure step is known as $E_1$. Depth of the pattern 121 on the photoresist layer 11 is known as $t_1$. The first exposure dose $E_1$ of first exposure step at least allows pattern 121 can be observed by the microscope during aligning.

Figure 3:
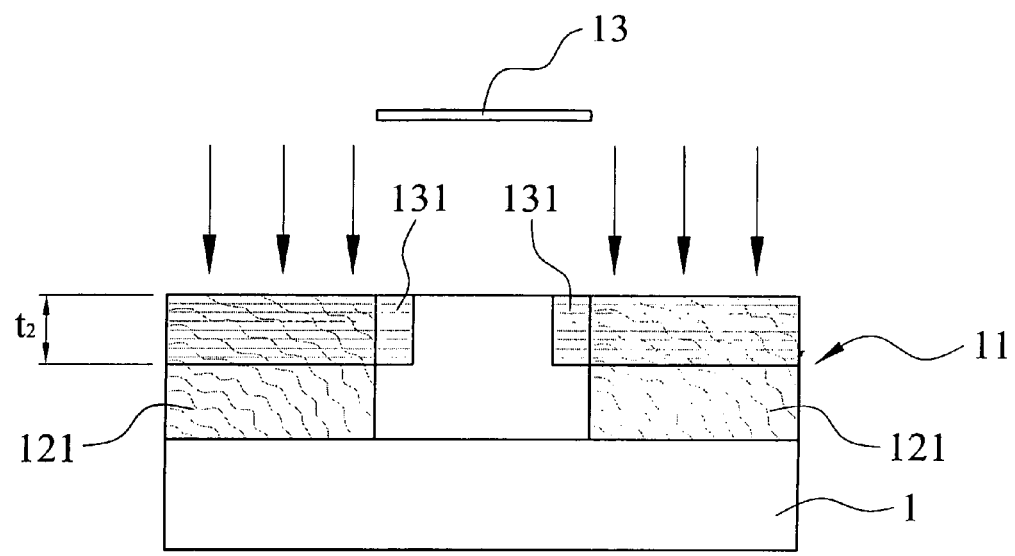
FIG. 3 is a view showing step (3) according to the present invention.

Please refer to FIG. 3, that disclose to transfer the pattern of the second mask 13 by second exposure step. The second exposure dose is known as $E_2$. The pattern of second mask 13 can be transferred to the positive photoresist layer 11 by aligning the pattern 121 caused by the first exposure step. The second exposure forms a specific area 131 which is easy dissoluble in developer. Depth of positive pattern 131 is known as $t_2$. By readjustment of second exposure dose $E_2$, pattern 131 can be limited on the parts of positive photoresist layer 11. The depth $t_1$ and $t_2$ of specific area 121 and 131 separately is different which is caused by the different exposure dose $E_1$ and $E_2$ during the first exposure and the second exposure separately.

Figure 4:
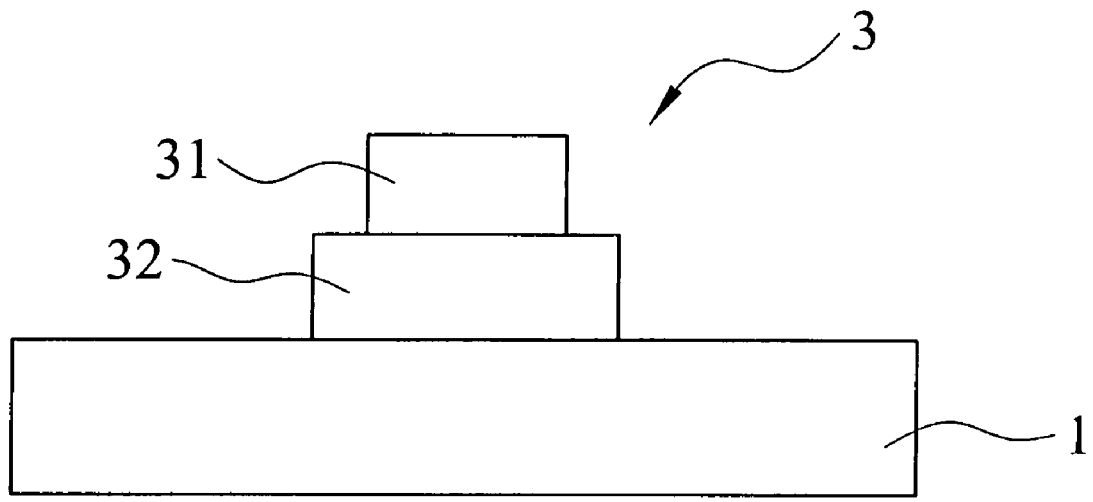
FIG. 4 is a view showing step (4) according to the present invention.

With further reference to FIG. 4, dipping the substrate 1 into the developer for dissolving exposing portions 121 and 131 on the positive photoresist layer 11. And forming a positive photoresist micro-structure 3 with specific dimensions and protruding and recessing structure on the positive photoresist layer 11. The positive photoresist micro-structure 3 can be defined by patterns of the first mask 12 and the second mask 13. Also, the positive photoresist micro-structure 3 comprise of a cylinder-shaped 31 and a photoresist plate 32.

The FIG. 5 show that reflow process is applied to the positive photoresist layer with high temperature to form partly sphere structure from cylinder-shaped structure 31 which cooperates with the photoresist plate 32. Finally, SSIL is formed inside the structure 3a.

The present invention may be embodied in other specific forms without departing from the spirit of the essential attributes thereof, therefore, the illustrated embodiment should be considered in all respects as illustrative and not restrictive, reference being made to the appended claims rather than to the foregoing description to indicate the scope of the invention.

What is claimed is:

1. A method for fabricating supersphere solid immersion lens, which comprises the steps of:
    a) coating a positive photoresist layer on a substrate;
    b) applying a first mask on the positive photoresist layer, transferring a first pattern of the first mask on the positive photoresist layer, and forming a first photoresist pattern on the positive photoresist layer by a first exposure;
    c) applying a second mask on the positive photoresist layer, transferring a second pattern of the second mask on the positive photoresist layer, and forming a second photoresist pattern on the positive photoresist layer by a second exposure, the second pattern of the second mask is transferred to predetermined areas of the positive photoresist layer by aligning the second mask relative to the first photoresist pattern;
    d) forming a positive photoresist micro-structure by dissolving portions of the positive photoresist layer exposed by the first exposure and the second exposure by dipping the substrate and the positive photoresist layer in a developer; and
    e) forming a supersphere solid immersion lens (SSIL) structure by performingz a reflow process on the positive photoresist micro-structure.

2. The method according to claim 1, wherein the first photoresist pattern has a depth of at least 10 angstroms.

3. The method according to claim 1, wherein the first photoresist pattern formed in the applying step b) is visible with alignment equipment.

4. The method according to claim 1, wherein in the applying step b) an exposure dose of the first exposure is adjusted for a thickness and type of the positive photoresist layer being used.

5. The method according to claim 1, wherein the first photoresist pattern is different from the second photoresist pattern.

6. The method according to claim 1, wherein the second photoresist pattern has a depth of at least 10 angstroms.

7. The method according to claim 1, wherein the first photoresist pattern and the second photoresist pattern have overlapping portions.

8. The method according to claim 1, wherein in the applying step c) an exposure does of the second exposure is adjusted fora thickness and type of the positive photoresist layer being used.

9. The method according to claim 1, wherein the applying step c) includes applying a subsequent mask on the positive photoresist layer, transferring a subsequent pattern of the subsequent mask on the positive photoresist layer, and forming a subsequent photoresist pattern on the positive photoresist layer by a subsequent exposure, the subsequent pattern of the subsequent mask is transferred to predetermined areas of the positive photoresist layer by aligning the subsequent mask relative to a previously applied photoresist pattern.

10. The method according to claim 9, wherein in the step c) the step of applying the subsequent mask is repeated a predetermined number of times.

11. The method according to claim 1, wherein in the forming step e) the reflow process utilizes a temperature changing a cylinder shaped portion formed by the second photoresist pattern into a semi-spherical shape.

12. The method according to claim 1, wherein a photoresist plate is formed by the first photoresist pattern.

13. The method according to claim 1, wherein a cylinder shaped portion is formed by the second photoresist pattern.

* * * * *